US006928009B2

(12) United States Patent
Adams et al.

(10) Patent No.: US 6,928,009 B2
(45) Date of Patent: Aug. 9, 2005

(54) REDUNDANCY CIRCUIT FOR MEMORY ARRAY AND METHOD FOR DISABLING NON-REDUNDANT WORDLINES AND FOR ENABLING REDUNDANT WORDLINES

(75) Inventors: Chad Allen Adams, Byron, MN (US); Gregory John Uhlmann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 123 days.

(21) Appl. No.: 10/600,064

(22) Filed: Jun. 20, 2003

(65) Prior Publication Data

US 2004/0257886 A1 Dec. 23, 2004

(51) Int. Cl.[7] ................................. G11C 7/00
(52) U.S. Cl. .................. 365/200; 365/189.07
(58) Field of Search ........................ 365/200, 189.07, 365/230.06

(56) References Cited

U.S. PATENT DOCUMENTS

| 5,930,183 | A | * | 7/1999 | Kojima et al. ............... 365/200 |
| 6,078,534 | A |  | 6/2000 | Pfefferl et al. |
| 6,272,057 | B1 | * | 8/2001 | Koshikawa .................. 365/200 |
| 6,522,595 | B2 | * | 2/2003 | Carson et al. ............ 365/225.7 |
| 6,694,448 | B2 | * | 2/2004 | Callahan ......................... 714/7 |

* cited by examiner

*Primary Examiner*—Son Mai
(74) *Attorney, Agent, or Firm*—Joan Pennington

(57) ABSTRACT

A redundancy circuit for a memory array and a method are provided for disabling non-redundant wordlines and for enabling redundant wordlines. A memory defect address is compared with a current address to be accessed. When there is a miscompare, the access to a non-redundant wordline is allowed to take place as normal. When the memory defect address matches the current address the entire wordline decoder is deactivated through a reset signal and the redundant wordline is activated.

19 Claims, 9 Drawing Sheets

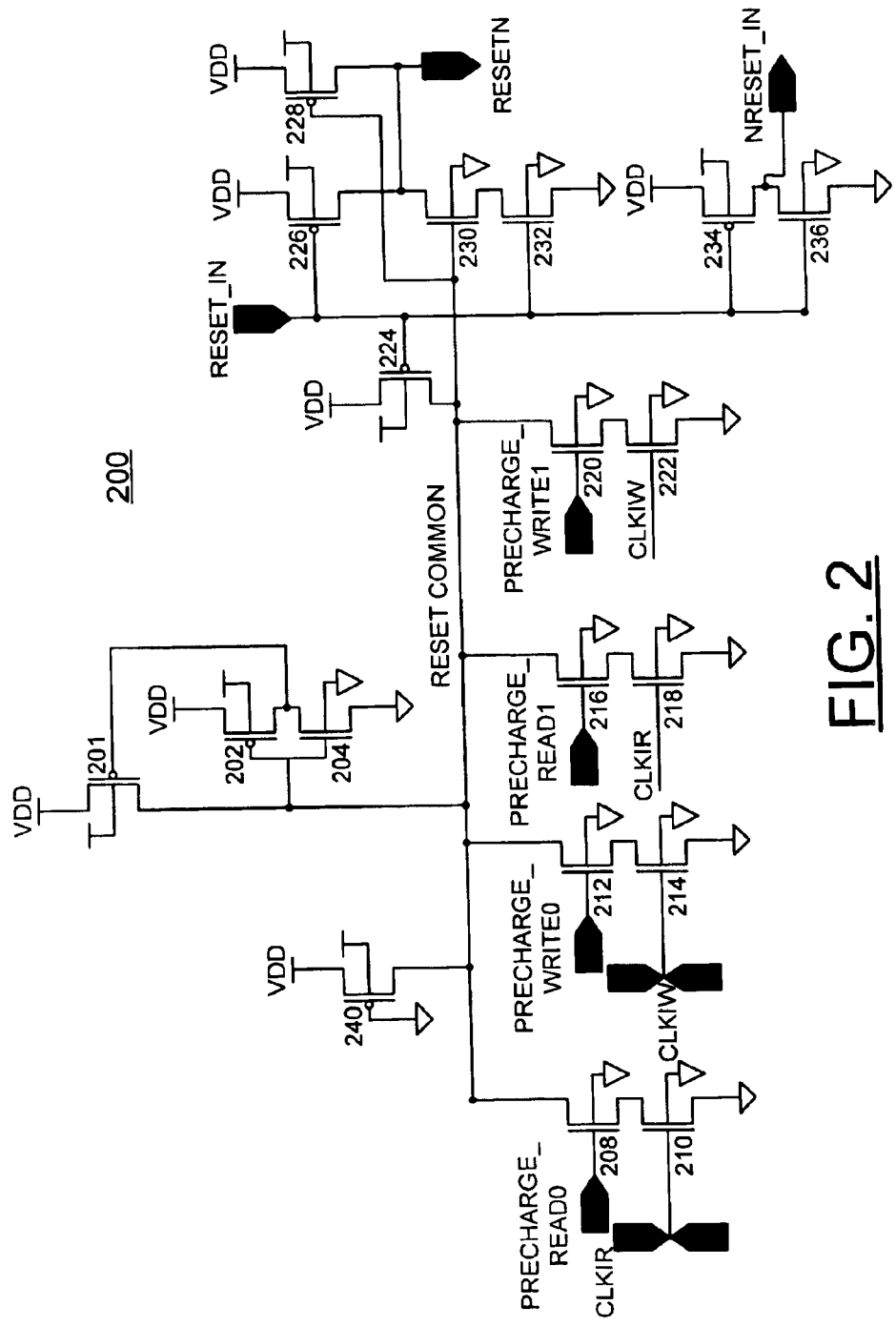

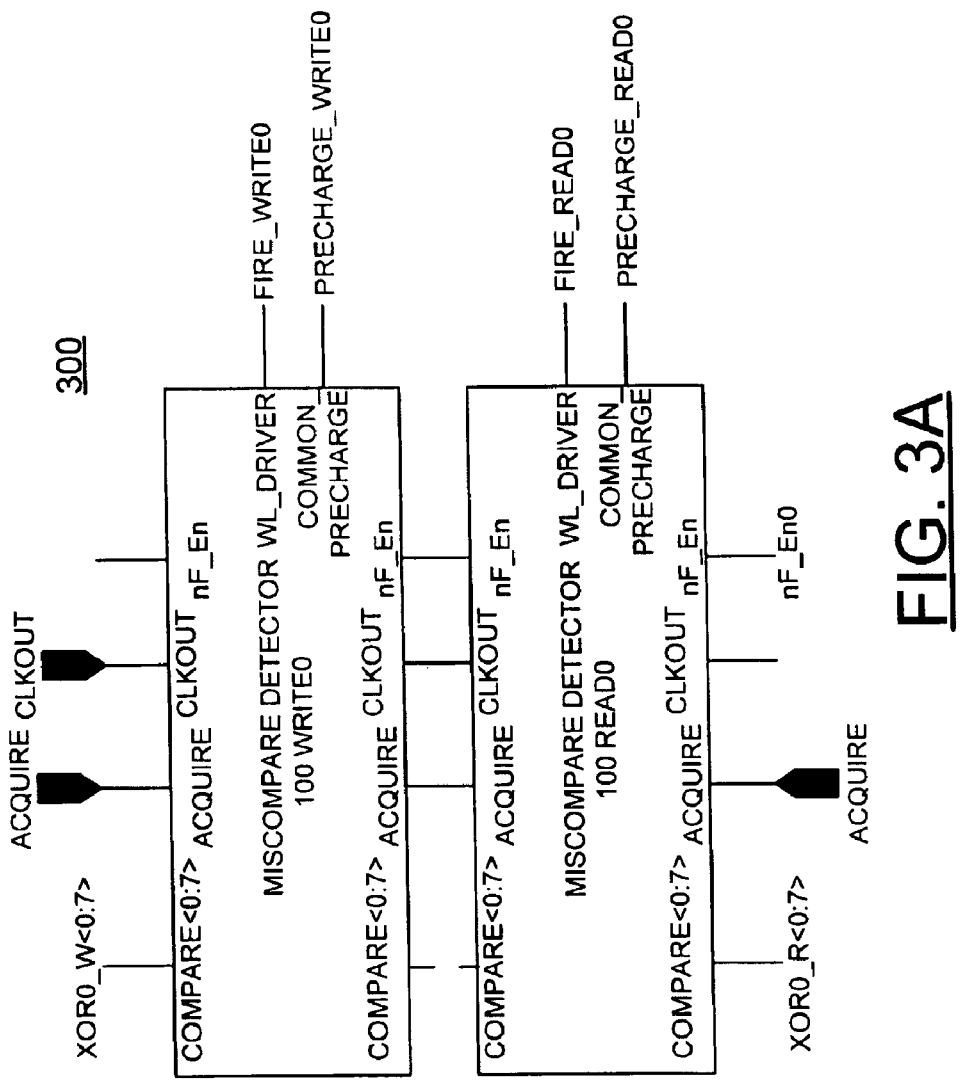

REDUNDANCY CIRCUIT FOR MEMORY ARRAY AND METHOD FOR DISABLING NON-REDUNDANT WORDLINES AND FOR ENABLING REDUNDANT WORDLINES

FIELD OF THE INVENTION

The present invention relates generally to the data processing field, and more particularly, relates to a redundancy circuit for a memory array and a method for disabling non-redundant wordlines and for enabling redundant wordlines.

DESCRIPTION OF THE RELATED ART

In order to improve yield of memory arrays, the ability to utilize redundant words is a necessity. When a chip is manufactured, it is done on a wafer with many copies of the chip filling the surface area of the wafer. Many of these chips will have defects as a result of the manufacturing process. These defects can be such that connections on the chip are either permanently shorted together or permanently open such that there is no connection where there ought to be one. Typically such defects are detected in the manufacturing process and chips that contain them are discarded.

Memory arrays are very regular structures that take up vast amounts of space on a chip. Memory arrays, thus, are prone containing defects as a percentage of all the pieces that make up the chip. To mitigate this, a technique called redundancy was developed and is common in the industry.

Essentially, an array implemented with redundancy has extra groups of memory cells including rows (wordlines) or columns (bitlines) or both. If the array is determined by its array built-in self-test (ABIST) to not have any defects, then the redundant memory elements are not activated or used. If defects in a redundancy array are detected, the ABIST determines if the defect can be fixed by utilizing any of the redundant elements available. Some defects still cannot be fixed and these chips are discarded.

If a defect in a memory array can be fixed with a redundant wordline or bitline, then the redundancy method and apparatus particular to that specific memory array needs to be activated.

A need exists for an improved redundancy circuit for a memory array and a method for disabling non-redundant wordlines and for enabling redundant wordlines. It is desirable to provide such redundancy circuit for a memory array and a method for disabling non-redundant wordlines and for enabling redundant wordlines for use with an existing array design with no redundancy.

SUMMARY OF THE INVENTION

A principal object of the present invention is to provide a redundancy circuit for a memory array and a method for disabling non-redundant wordlines and for enabling redundant wordlines. Other important objects of the present invention are to provide such redundancy circuit for a memory array and a method for disabling non-redundant wordlines and for enabling redundant wordlines substantially without negative effect and that overcome many of the disadvantages of prior art arrangements.

In brief, a redundancy circuit for a memory array and a method are provided for disabling non-redundant wordlines and for enabling redundant wordlines. A memory defect address is compared with a current address to be accessed. When there is a miscompare, the access to a non-redundant wordline is allowed to take place as normal. When the memory defect address matches the current address the entire wordline decoder is deactivated through a reset signal and the redundant wordline is activated.

A miscompare detector compares a current address to be accessed with a defect address. The miscompare detector provides an enable redundant wordline signal responsive to a match of the compared addresses. A deactivate driver circuit coupled to the miscompare detector disables non-redundant wordlines responsive to the enable redundant wordline signal. A redundant driver coupled to the miscompare detector enables a redundant wordline responsive to the enable redundant wordline signal.

BRIEF DESCRIPTION OF THE DRAWINGS

The present invention together with the above and other objects and advantages may best be understood from the following detailed description of the preferred embodiments of the invention illustrated in the drawings, wherein:

FIG. 2 is a schematic diagram illustrating an exemplary deactivate driver circuit for deactivating a non-redundant wordline decoder in accordance with the preferred embodiment;

FIGS. 3A, 3B, 3C, and 3D together provide a cell diagram representation illustrating an exemplary redundancy circuit for a memory array including four miscompare detectors of FIG. 1 and the deactivate driver circuit of FIG. 2 in accordance with the preferred embodiment;

DETAILED DESCRIPTION OF THE PREFERRED EMBODIMENTS

In accordance with features of the preferred embodiment, a new redundancy circuit and a method are provided for implementing redundancy for a memory array, for example, for use with an existing array that had been previously implemented without redundancy.

The redundancy method of the preferred embodiment assumes that the address bits referring to the memory section containing the defect are readily available signals. These signals could come from fuses or latches elsewhere on the chip that have been permanently activated as a part of the manufacturing process. It should be understood that the memory section with the defect could either be a bitline or a wordline, while the present descriptions refers to wordlines for simplicity.

Figure 1:
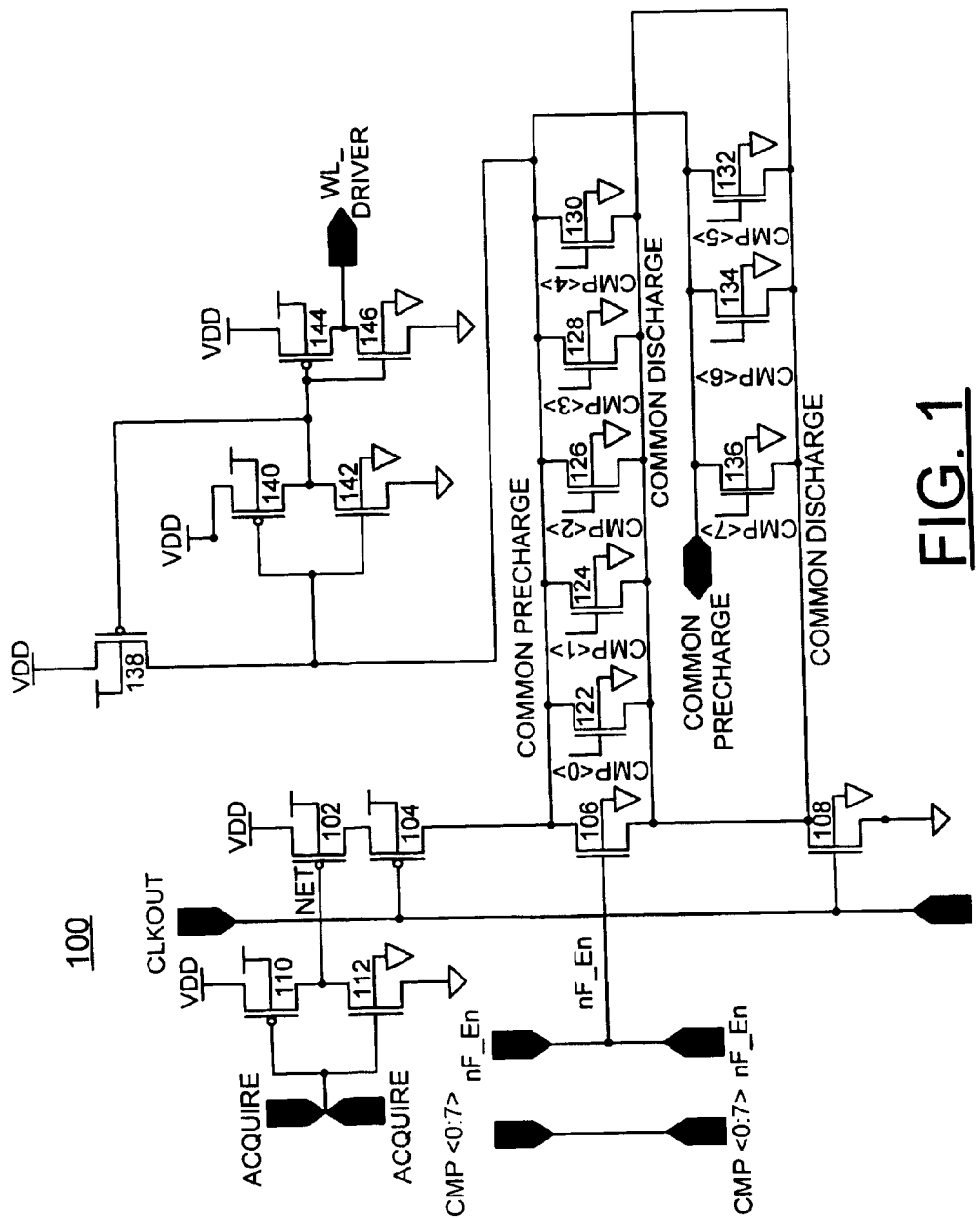
FIG. 1 is a schematic diagram illustrating an exemplary miscompare detector for enabling access to a redundant wordline with a match of a fuse address and disabling non-redundant wordlines in accordance with the preferred embodiment.

In accordance with features of the preferred embodiment, a memory defect address or fuse address is compared with a current address to be accessed. FIG. 1 illustrates an exemplary miscompare detector in accordance with the preferred embodiment. If there is a miscompare, the access is allowed to take place as normal. When the fuse address matches the current address the entire wordline decoder is deactivated through a reset signal and the redundant wordline is activated. FIG. 2 illustrates an exemplary deactivate driver circuit for deactivating a non-redundant wordline decoder in accordance with the preferred embodiment.

Having reference now to the drawings, in FIG. 1, there is shown an exemplary miscompare detector generally designated by the reference character 100 of the preferred embodiment. Miscompare detector 100 is a dynamic circuit for comparing a current address to be accessed with a fuse address for enabling a redundant wordline with a match of the fuse address and disabling non-redundant wordlines in accordance with the preferred embodiment. The ACQUIRE and CLKOUT signals can be considered clocks. The combination of a pair of P-channel field effect transistors (PFETs) 102 and 104 form a precharge circuit coupled between a positive supply VDD and a common precharge node labeled COMMON PRECHARGE. A pair of N-channel field effect transistor (NFETS) 106, 108 is coupled in series between the common precharge node and ground. The source drain connection of NFETs 106, 108 is connected to a common discharge node labeled COMMON DISCHARGE. NFET 108 is a discharge device. An inverter formed of a PFET 110 and an NFET 112 is connected in series between the voltage supply VDD and ground. A common drain connection of PFET 110 and NFET 112 is connected to a gate of precharge PFET 102 at a node labeled NET. The ACQUIRE signal is applied to a gate input of PFET 110 and NFET 112. The CLKOUT signal is applied to a gate input of precharge PFET 104 and discharge NFET 108. An enable signal labeled nF_En is applied to a gate input of NFET 106.

As shown, a plurality of compare NFETs (1-N) 122, 124, 126, 128, 130, 132, 134 and 136 are connected between the common precharge node and the common discharge node. A particular number N of compare NFETs is provided depending upon the number of address bits in the decoder being affected by the redundancy. A PFET 138 is connected between the voltage supply VDD and the common precharge node. A first series connected PFET 140 and NFET142 and a second series connected PFET 144 and NFET146 are connected between the voltage supply VDD and ground. A common gate connection of PFET 140 and NFET142 is connected to the common precharge node. A common gate connection of PFET 144 and NFET146 is connected to a gate of PFET 138 and to the common drain connection of PFET 140 and NFET 142. A wordline driver output labeled WL_DRIVER is provided at the common drain connection of PFET 144 and NFET 146.

When the ACQUIRE signal is high and the CLKOUT signal is low, the common precharge node is precharged to the positive supply VDD. When CLKOUT goes high, the common precharge node is able to either discharge to ground or maintain its precharged state. If any of the compare NFETs (1-N) 122, 124, 126, 128, 130, 132, 134 and 136 is activated, there has been a miscompare between the fuse address and the current address. In this case, the CMP<x> signal will be high, where x represents any of CMP<0> through CMP<7> and the common precharge node discharges through the discharge NFET 108. The wordline driver output labeled WL_DRIVER signal tracks with Common_Precharge. When the common precharge node discharges, an access to the redundant wordline is prevented. In the case of match between the fuse address and the current address, then none of the compare NFETs (1-N) 122, 124, 126, 128, 130, 132, 134 and 136 is activated. In this case, the common precharge node maintains its precharged state, and thus, the access will go to the redundant wordline.

Referring now to FIGS. 2, 3A, 3B, 3C, and 3D, in FIG. 2 there is shown an exemplary deactivate driver circuit to deactivate the non-redundant Wordline Decoder (WDEC) generally designated by the reference character 200 of the preferred embodiment. FIGS. 3A, 3B, 3C, and 3D together illustrate an exemplary redundancy circuit for a memory array generally designated by the reference character 300. The exemplary redundancy circuit 300 includes four miscompare detectors 100 of FIG. 1 with the deactivate driver circuit 200 of FIG. 2 in accordance with the preferred embodiment.

Deactivate circuit 200 includes a keeper circuit formed by a pair of PFETs 201, 202 and an NFET 204 with PFET 201 coupled between voltage supply VDD and a reset common node labeled RESET COMMON. A gate input of PFET 202 and NFET 204 is connected to the reset common node and a gate input of PFET 201 is connected to the common drain connection of PFET 202 and NFET 204. Deactivate circuit 200 includes a plurality of 2-high NFET stacks formed by respective pairs of NFETs 208, 210; 212, 214; 216, 218; and 220, 222, each pair coupled between the reset common node and ground. Deactivate circuit 200 includes a PFET 224 coupled between the voltage supply VDD and the reset common node with a gate input of a RESET_IN signal. A pair of PFETs 226, 228 having a source connection to the voltage supply VDD and a respective gate connection to the RESET_IN signal and the reset common node. A pair of series connected NFETs 230, 232 are connected between common drain connection of PFETs 226, 228 and ground. A gate of NFET 230 is connected to the reset common node. A gate of NFET 232 is connected to the RESET_IN signal. The common drain connection of PFETs 226, 228 provides a RESETN output. A series connected PFET 234 and NFET 236 is connected between the voltage supply VDD and ground having a common gate input of the RESET_IN signal. The common drain connection of PFET 234 and NFET 236 provides an inverted signal NRESET_IN signal.

Figure 3B:
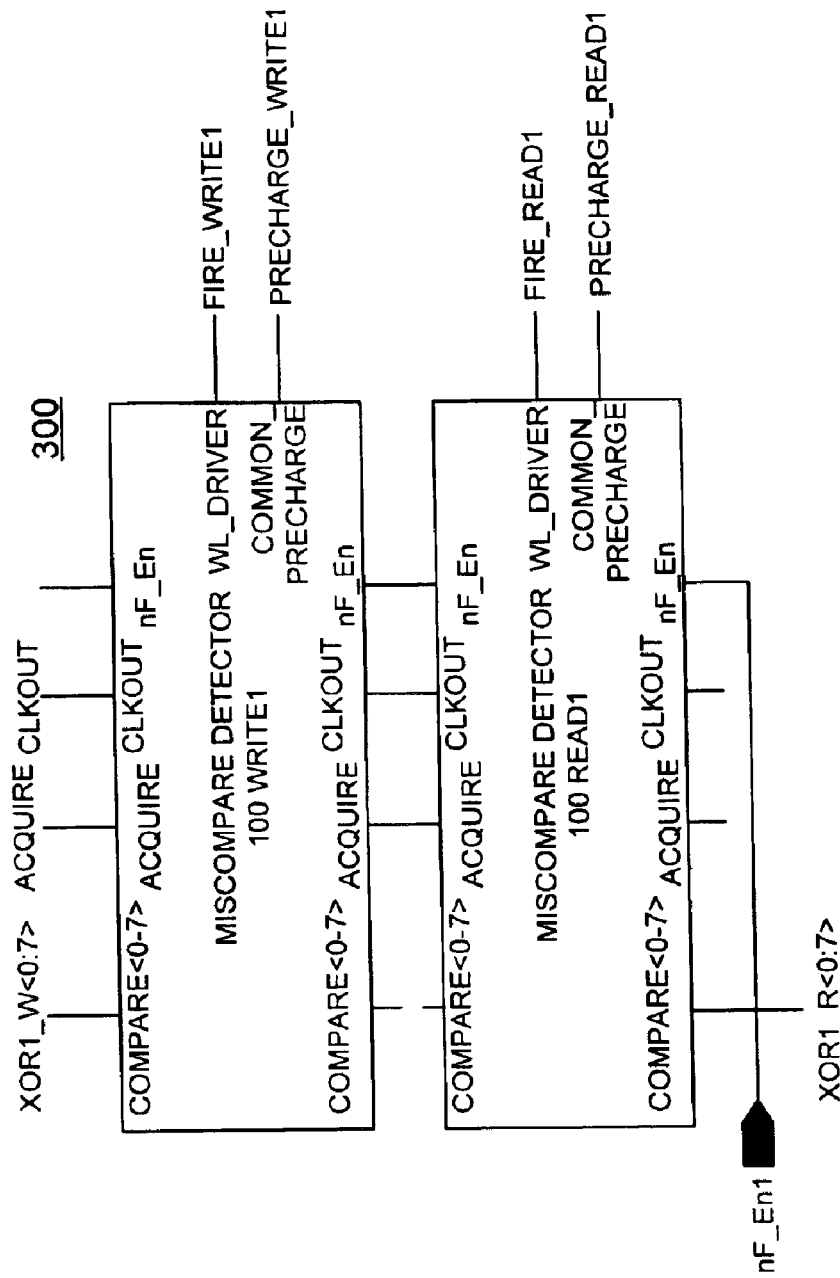

Deactivate driver circuit 200 is also dynamic in nature and the RESET_IN signal acts as a clock in that through PFET 224, when RESET_IN goes low, the reset common node is precharged to Vdd. Also, when RESET_IN goes low, the signals RESETN and NRESET_IN are pulled high and the reset common node is left to dynamically maintain its precharge state when RESET_IN goes high or be discharged through one of the four two-high NFET stacks made up of NFETs 208, 210; 212, 214; 216, 218; and 220, 222. A respective gate of NFETs 208, 212, 216, and 220 is tied to PRECHARGE_READ0, PRECHARGE_WRITE0, PRECHARGE_WRITE1, PRECHARGE_READ01. Each of the gate inputs PRECHARGE_READ0, PRECHARGE_WRITE0, PRECHARGE_WRITE1, PRECHARGE_READ01 is the common precharge port of an individual miscompare detector 100 as shown in FIG. 1. As shown in FIGS. 3A and 3B, four miscompare detectors 100 are used with the deactivate driver circuit 200. A gate input of NFETS 210, 218 is connected to a CLKIR signal and a gate input of NFETS 214, 222 is connected to a CLKIW signal.

The CLKIR and CLKIW signals are clocks that activate while RESET_IN is high. The combination of PFETs 201, 202, and NFET 204 form the keeper circuit common to dynamic circuits. While not necessary, PFETs 201, 202, and NFET 204 make the deactivate driver circuit 200 more robust in that while the dynamic node, RESET COMMON, is floating high, the keeper, specifically PFET 201, will be weakly on and keep the dynamic node in a high state. When the reset common node discharges, then PFET 201 is shut off. Deactivate driver circuit 200 includes a saver PFET 240 coupled between the voltage supply VDD and the reset common node. Saver PFET 240 is a very small, weak PFET that is always on because its gate is tied to ground. Again, the saver PFET 240 is not necessary, but it also makes the deactivate driver circuit 200 robust in that PFET 240 helps keep the dynamic node high without providing much resistance when it is discharged. A reason for implementing this PFET 240 when there already is a keeper circuit is to insure that the dynamic reset common node always starts in a precharged state when the deactivate driver circuit 200 is powered on.

In the deactivate driver circuit 200, there can be a variable number N of the 2-high NFET stacks. The number N depends on how many different addresses are being compared. In the example of FIG. 2, there are two different addresses being compared. In other words in the example of the deactivate driver circuit 200, there are two redundant wordlines available, Redundant Wordline 0, and Redundant Wordline 1. Each of the two redundant wordlines is able to replace a non-redundant wordline. The address of the redundant wordline is compare-detected in a miscompare detector 100 shown in FIG. 1. Each redundant wordline can be compared for a read or a write operation. So for Redundant Wordline 0, there is a read address compare and a write address compare; each requiring a separate implementation of the miscompare detector 100 of FIG. 1. The same situation exists for Redundant Wordline 1. Thus, there are four different NFET stacks made up of NFETs 208, 210; 212, 214; 216, 218; and 220, 222 in the deactivate driver circuit 200.

The RESETN signal output of PFETs 226 and 228 controls the WDEC for the non-redundant wordlines. If RESETN goes low, then this WDEC is enabled to select a wordline for access. If it remains high, the entire WDEC is disabled. Therefore, if the common precharge port of the four individual miscompare detectors 100 discharge, then the reset common node cannot discharge and, thus, the wordline being accessed is in the non-redundant wordlines. If one common precharge port of the miscompare detectors 100 does not discharge, then the reset common node discharges through the corresponding NFET stack. This keeps the RESETN output signal from dropping to disable the non-redundant wordlines.

Figure 3C:
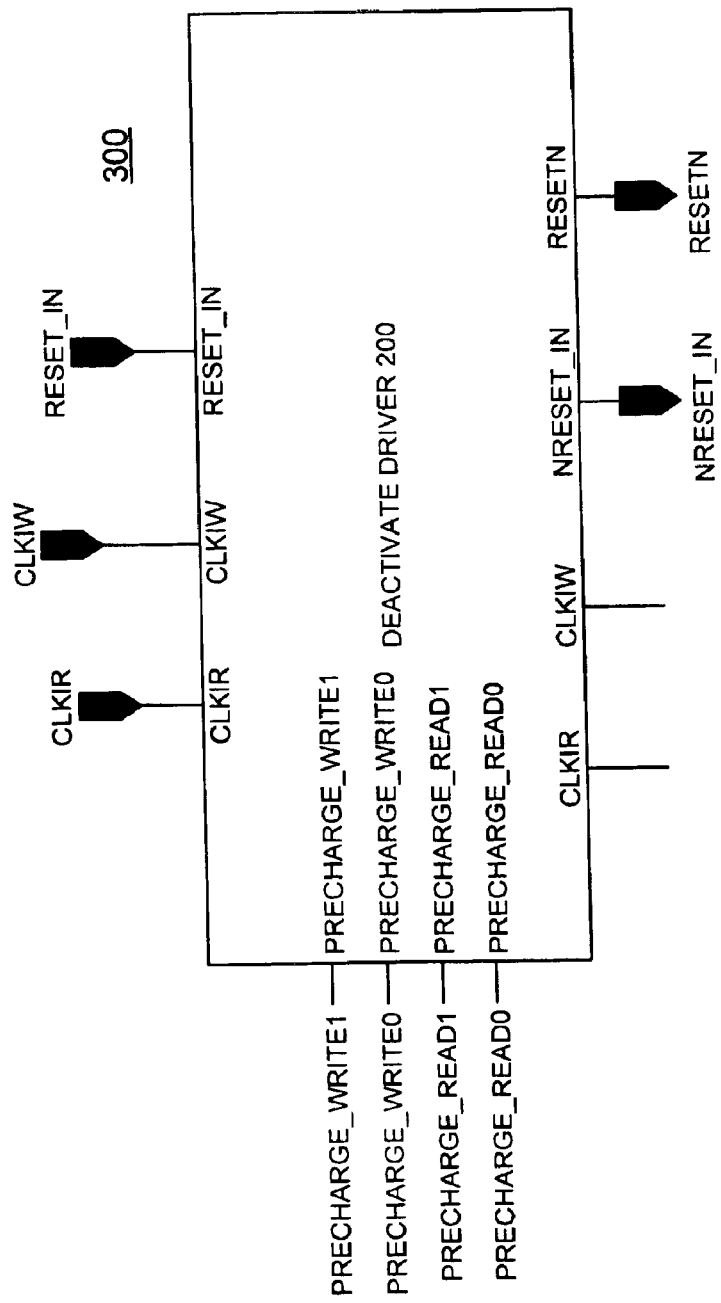
Figure 3D:
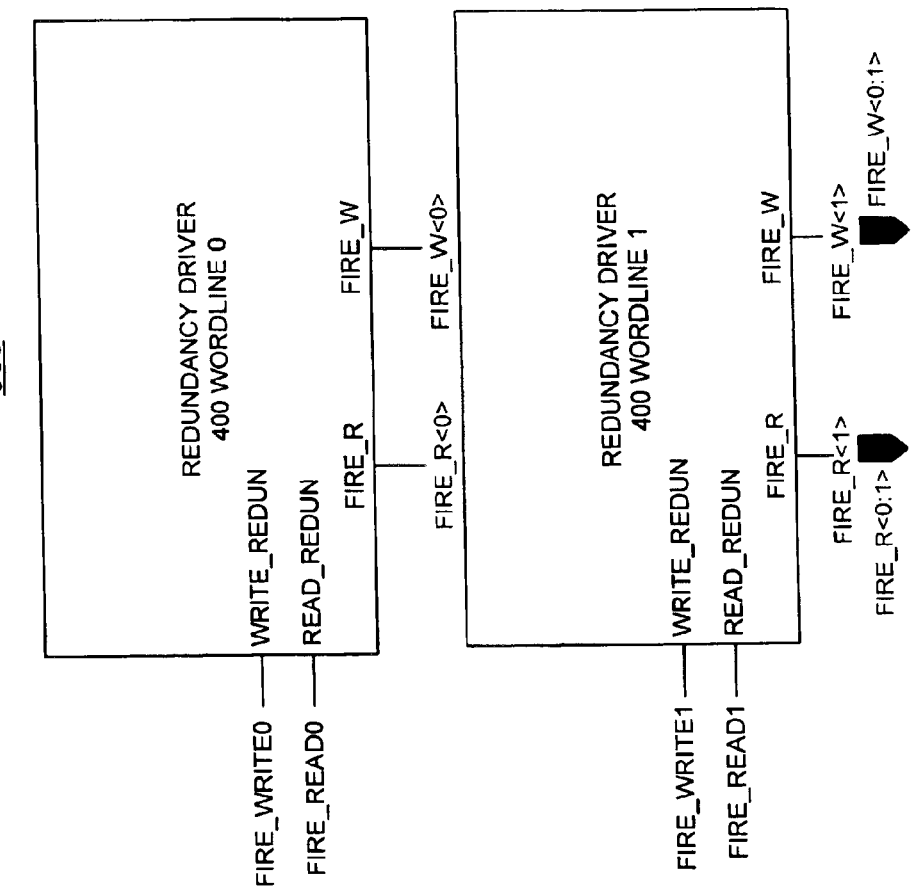

The NRESET_IN signal is applied to a pair of redundant wordline drivers, as shown in FIG. 3D. The NRESET_IN signal always tracks as the inverse of the RESET_IN signal and always enables the wordline drivers for the redundant wordlines when it drops. The redundant wordline drivers do not select their respective wordline for access, however; they are just enabled to do so. What is necessary is also the WL_driver signal from the respective miscompare detector 100 of FIG. 1. This WL_DRIVER signal indicates, if it is high, that indeed a match has occurred and the non-redundant wordlines are being disabled. This WL_DRIVER signal also shows the match for the specific wordline and thus it can be used to select the redundant wordline replacing the non-redundant one.

In FIG. 3A, the illustrated miscompare circuits 100 are respectively labeled WRITE0, READ0 and in FIG. 3B, the illustrated miscompare circuits 100 are respectively labeled WRITE1, READ1. The WL_driver signal from the respective miscompare detectors 100 is respectively renamed FIRE_WRITE0, FIRE_READ0, FIRE_WRITE1, and FIRE_READ1. The common precharge node signal from the respective miscompare detectors 100 is labeled respectively PRECHARGE_WRITE0, PRECHARGE_READ0, PRECHARGE_WRITE1, and PRECHARGE_READ1.

As shown in FIG. 3C and described with respect to FIG. 2, the PRECHARGE_WRITE0, PRECHARGE_READ0, PRECHARGE_WRITE1, and PRECHARGE_READ1 signals from the respective miscompare detectors 100 of FIGS. 3A and 3B are applied to the deactivate driver circuit 200. The clocks CLKIR, CLKWR and RESET_IN are applied to the deactivate driver circuit 200 and outputs NRESET_IN and RESETN are provided.

Figure 4:
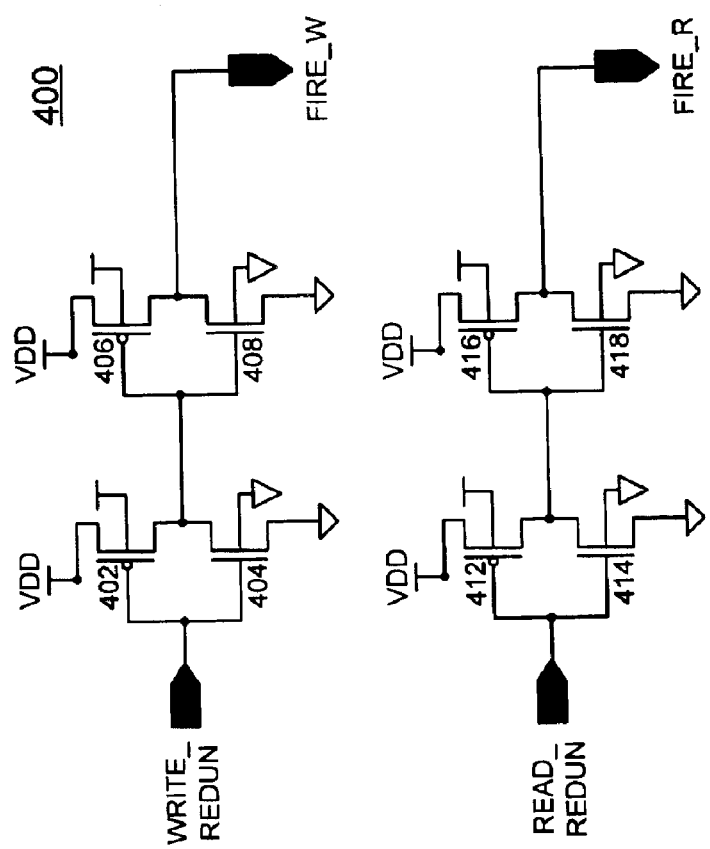
FIG. 4 is a schematic diagram illustrating a redundancy driver circuit shown in FIG. 3D of the exemplary redundancy circuit of FIGS. 3A, 3B, 3C, and 3D in accordance with the preferred embodiment.

As shown in FIG. 3D, the redundancy circuit 300 includes a respective redundancy driver 400 for wordline 0 and wordline 1. FIG. 4 illustrates an exemplary redundancy driver circuit 400. The FIRE_WRITE0, FIRE_READ0 to redundancy driver 400 wordline 0 and FIRE_WRITE1, and FIRE_READ1 to redundancy driver 400 wordline 0 are renamed WRITE_REDUN and READ_REDUN as shown in FIG. 3D.

As shown in FIG. 4, each redundancy driver circuit 400 includes a write buffer formed by a first series connected PFET 402 and NFET 404 and a second series connected PFET 406 and NFET 408 connected between the voltage supply VDD and ground. A common gate connection of PFET 402 and NFET 404 is connected to the WRITE_REDUN signal. A common gate connection of PFET 406 and NFET 408 is connected to the common drain connection of PFET 402 and NFET 404. A wordline driver output labeled FIRE_W is provided at the common drain connection of PFET 406 and NFET 408. Each redundancy driver circuit 400 includes a read buffer formed by a first series connected PFET 412 and NFET 414 and a second series connected PFET 416 and NFET 418 connected between the voltage supply VDD and ground. A common gate connection of PFET 412 and NFET 414 is connected to the READ_REDUN signal. A common gate connection of PFET 416 and NFET 418 is connected to the common drain connection of PFET 412 and NFET 414. A wordline driver output labeled FIRE_R is provided at the common drain connection of PFET 416 and NFET 418.

Figure 5:
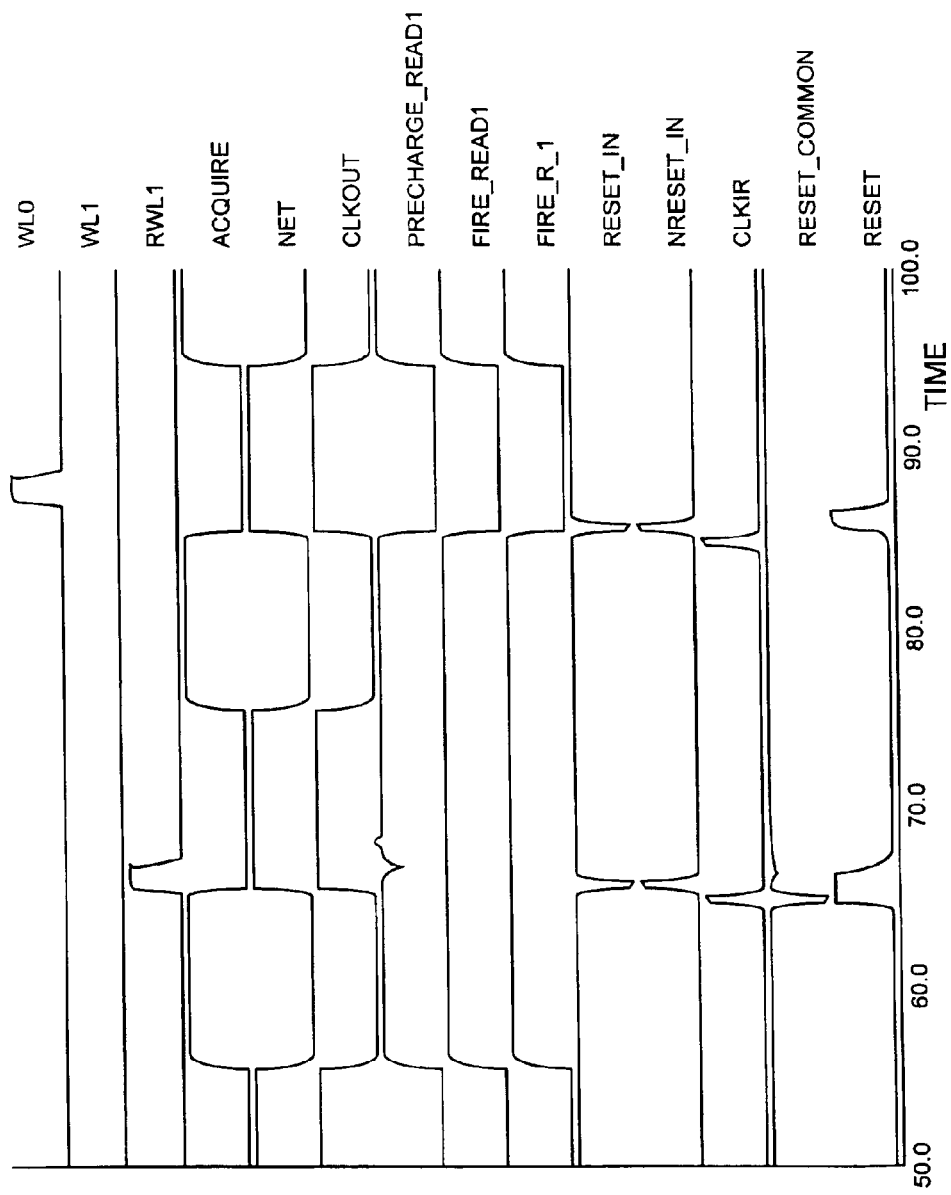
FIG. 5 is a timing diagram illustrating operation of the exemplary redundancy circuit of FIGS. 3A, 3B, 3C, and 3D in accordance with the preferred embodiment.

Referring now to FIG. 5, there is a timing diagram illustrating operation of the exemplary redundancy circuit 300 of FIGS. 3A, 3B, 3C, and 3D in accordance with the preferred embodiment. Time is shown in nanoseconds for the illustrated graph of FIG. 5. The illustrated waveforms include WL0, WL1, RWL1, the ACQUIRE and CLKOUT signals in FIG. 3A, NET corresponding to a NET node of the miscompare detector 100 of FIG. 1, the PRECHARGE_READ1 and the FIRE_READ1 in FIG. 3B, the FIRE_R_1 in FIG. 3D, the RESET_IN, NRESET_IN, CLKIR of FIG. 3C, RESET_COMMON corresponding to the reset common node of the deactivate driver circuit 200 of FIG. 2, and a RESET signal described below. Between 50 nsec and 70 nsec, there is a match between the fuse address and the address being read as indicated at a line RWL1. In this case, the redundant wordline should be selected. When ACQUIRE goes high and CLKOUT goes low, PRECHARGE_READ1 goes high. When CLKOUT goes high, PRECHARGE_READ1 stay high because the address match. This causes FIRE_READ1 and thus FIRE_R_1 to remain high. Also, since PRECHARGE_READ1 is high, when CLKIR turns on, RESET_COMMON is caused to fall to zero. This causes RESET to go high. RESET stays high when RESET_IN drops, however RESET_IN dropping causes the RESET_COMMON node to return to Vdd. RESET stays high until RESET_IN returns to Vdd.

Three important signals are RESET, NRESET_IN, and FIRE_R_1. RESET disables all of the non-redundant wordline drivers when it is at Vdd. To implement this, one skilled in the art would be able to take RESET, invert it, and then AND it with a particular signal that would otherwise drive the wordline if redundancy were not being implemented.

In this specific illustrated implementation 300 and as shown in FIG. 5, the wordline driver will activate when CLKIR rises. It will not deactivate until RESET drops. In non-redundancy operation, RESET rises after CLKIR has risen. However, if RESET is already high, as in redundancy operation, the wordline drivers stay deactivated even when CLKIR rises. The other two signals, NRESET_IN and FIRE_R_1, are applied to the redundant wordline drivers.

Figure 6:
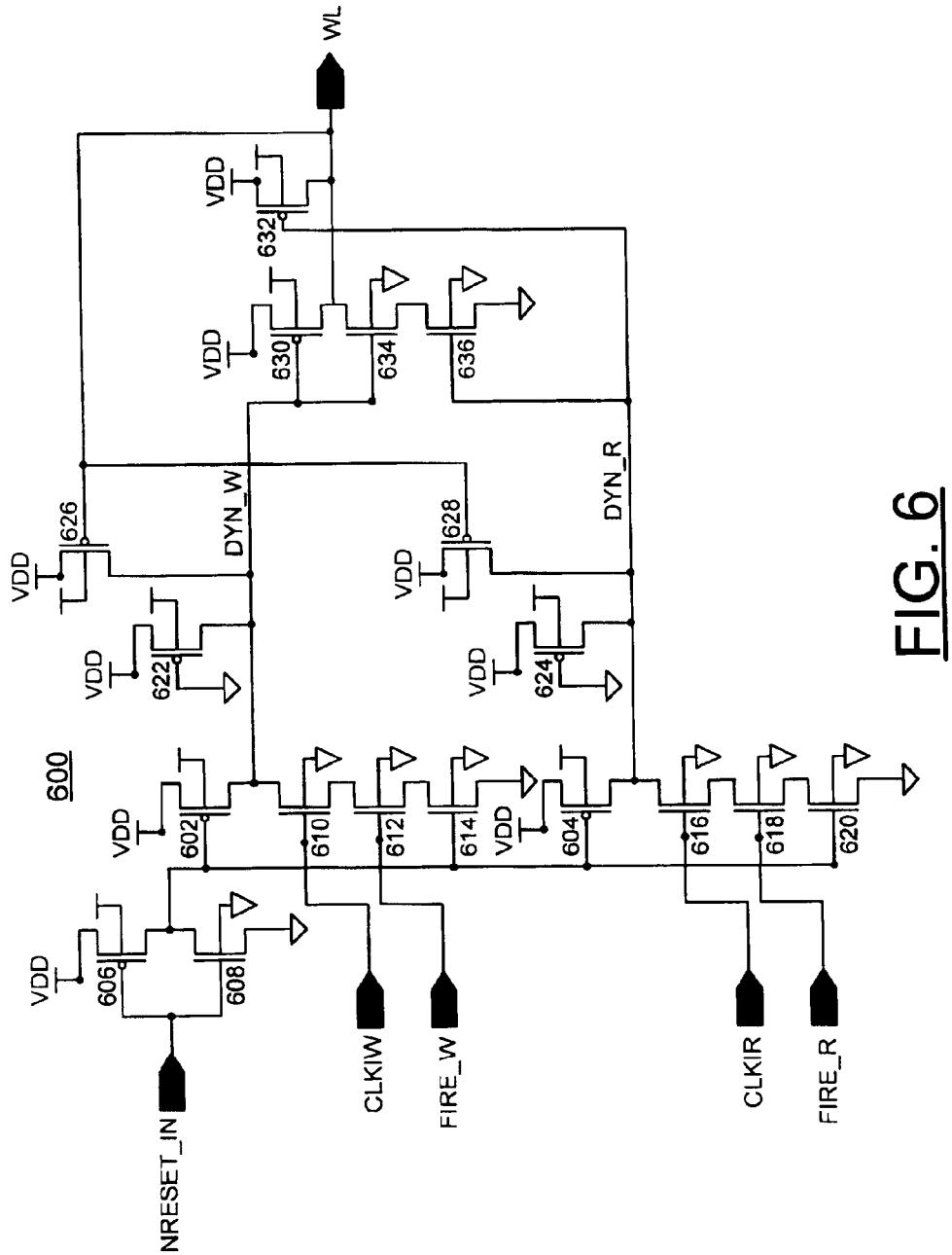
FIG. 6 is a schematic diagram illustrating a wordline selector circuit for selecting a wordline to be accessed in accordance with the preferred embodiment.

FIG. 6 illustrates a wordline driver or selector circuit for selecting a wordline to be accessed generally designated by the reference character 600 of the preferred embodiment. Wordline selector circuit 600 is dynamic in nature. Also, the illustrated wordline selector circuit 600 has separate parts for Read and Write operations as designated by the R and W after the signal names. This is necessary if there are different address buses for reads and writes that are available during the same cycle; that is, a read and a write can occur in the same cycle and can be to different addresses. If this is the case, then there will be separate comparisons for each address and thus different select signals.

Wordline selector circuit 600 includes a respective precharge PFET 602, 604 coupled between the voltage supply VDD and a respective one of dynamic nodes DYN_W, DYN_R. A PFET 606 and an NFET 608 are connected in series between the voltage supply VDD and ground. The NRESET_IN signal is applied to a common gate input of PFET 606 and NFET 608.

A stack of NFETs 610, 612, 614 is coupled between dynamic node DYN_W and ground. A stack of NFETs 616, 618, 620 is coupled between dynamic node DYN_R and ground. The common drain connection of PFET 606 and NFET 608 is connected to the gate of the precharge PFETs 602, 604, and to a gate input of discharge NFETs 614, 620. The CLKIW signal is applied to the gate of NFET 610 and the CLKIR signal is applied to the gate of NFET 616. The FIRE_W signal is applied to the gate of NFET 612 and the FIRE_R signal is applied to the gate of NFET 618.

A respective saver PFET 622, 624 coupled between the voltage supply VDD and the respective one of dynamic nodes DYN_W, DYN_R. Saver PFETs 622, 624 are very small, weak PFETs that are always on with their gates tied to ground insures that the dynamic nodes DYN_W, DYN_R start in a precharged state when the wordline selector circuit 600 is powered on.

Wordline selector circuit 600 includes a respective PFET 626, 628 coupled between the voltage supply VDD and the respective one of dynamic nodes DYN_W, DYN_R. A respective PFET 630, 632 has a source connected to the voltage supply VDD, and a gate input coupled to the respective one of dynamic nodes DYN_W, DYN_R. A series connected pair of NFETs 634, 636 are connected between a common drain connection of PFETs 630, 632 and ground. A gate of NFET 634 is connected to the dynamic node DYN_W. A gate of NFET 636 is connected to the dynamic node DYN_R. The common drain connection of PFETs 630, 632 provides a wordline select signal WL. PFET 626, 628 have a common gate connection to the wordline select signal WL.

Wordline selector circuit 600 is clocked by the NRESET_IN signal. NRESET_IN precharges the nodes DYN_W and DYN_R when NRESET_IN goes high and enables the nodes DYNW and DYNR to discharge when it is low. Clocks CLKIR and CLKIW are necessary because they designate when the Read and the Write actually occur. The FIRE_R and FIRE_W, buffered/renamed signals analogous to FIRE_R_1 in FIG. 5, indicate that an address match has occurred between the address being accessed and the fuse address or redundant address.

When three conditions are met, NRESET_IN low, CLKIR or CLKIW high, and FIRE_R or FIRE_W high, then DYN_W or DYN_R will discharge and thus the output WL will go high. WL selects the wordline to be accessed.

While the present invention has been described with reference to the details of the embodiments of the invention shown in the drawing, these details are not intended to limit the scope of the invention as claimed in the appended claims.

What is claimed is:

1. A redundancy circuit for a memory array comprising:
a miscompare detector for comparing a current address to be accessed with a memory defect address; said miscompare detector providing an enable redundant wordline signal responsive to a match of the compared addresses; said miscompare detector including a plurality of compare field effect transistors coupled between a common precharge node and a common discharge node;
a deactivate driver circuit coupled to said miscompare detector for disabling non-redundant wordlines responsive to said enable redundant wordline signal; and
a redundant driver coupled to said miscompare detector for enabling redundant wordlines responsive to said enable redundant wordline signal.

2. A redundancy circuit for a memory array as recited in claim 1 includes a wordline select circuit coupled to said redundant driver for selecting a redundant wordline responsive to said enable redundant wordline signal.

3. A redundancy circuit for a memory array as recited in claim 1 wherein said miscompare detector includes a precharge circuit coupled between a supply voltage and said common precharge node and a discharge device coupled between said common discharge node and ground.

4. A redundancy circuit for a memory array as recited in claim 3 wherein one of said plurality of compare field effect transistors is activated, said common precharge node is discharged to identify a miscompare of the compared addresses and an access to a non-redundant wordline is allowed.

5. A redundancy circuit for a memory array as recited in claim 1 wherein said match of the compared addresses is identified by said plurality of compare transistors being deactivated, said common precharge node is maintained in a precharge state.

6. A redundancy circuit for a memory array as recited in claim 1 includes for each redundant wordline a miscompare detector for a wordline read address and a miscompare detector for a word line write address.

7. A redundancy circuit for a memory array as recited in claim 6 wherein said deactivate driver circuit receives a common precharge node signal for each said read address miscompare detector and each said write address miscompare detector.

8. A redundancy circuit for a memory array as recited in claim 1 wherein said deactivate driver circuit generates a reset signal to deactivate a non-redundant wordline decoder responsive to said enable redundant wordline signal.

9. A redundancy circuit for a memory array comprising:

a miscompare detector for comparing a current address to be accessed with a memory defect address; said miscompare detector providing an enable redundant wordline signal responsive to a match of the compared addresses;

a deactivate driver circuit coupled to said miscompare detector for disabling non-redundant wordlines responsive to said enable redundant wordline signal; said deactivate driver circuit including a two-high field effect transistor stack coupled between a reset common node and ground; and a redundant driver coupled to said miscompare detector for enabling redundant wordlines responsive to said enable redundant wordline signal.

10. A redundancy circuit for a memory array as recited in claim 9 wherein said deactivate driver circuit couples common precharge node signal to said two-high field effect transistor stack to discharge said reset common node responsive to said match and generates a reset signal to deactivate a non-redundant wordline decoder.

11. A redundancy circuit for a memory array as recited in claim 9 wherein said deactivate driver circuit includes a keeper circuit coupled to said reset common node.

12. A redundancy circuit for a memory array as recited in claim 9 wherein said deactivate driver circuit includes a saver transistor coupled to said reset common node; said saver transistor being constantly activated and said saver transistor providing said reset common node in a precharged state when said deactivate driver circuit is activated.

13. A redundancy circuit for a memory array as recited in claim 9 wherein said redundant driver coupled to said miscompare detector for enabling redundant wordlines responsive to said enable redundant wordline signal includes a buffer circuit receiving said enable redundant wordline signal and providing a buffered enable redundant wordline signal output.

14. A redundancy circuit for a memory array as recited in claim 2 wherein said wordline select circuit coupled to said redundant driver for selecting a redundant wordline responsive to said enable redundant wordline signal includes a wordline select circuit for a wordline read address and a wordline select circuit for a wordline write address; said wordline select circuit for said wordline read address and said wordline select circuit for said wordline write address coupled to said deactivate driver circuit.

15. A redundancy circuit for a memory array as recited in claim 14 wherein said wordline select circuit for said wordline write address includes a dynamic write node and said wordline select circuit for said wordline read address includes a dynamic read node; said dynamic write node and said dynamic read node being precharged responsive to a clock output signal generated by said deactivate driver circuit.

16. A redundancy circuit for a memory array as recited in claim 14 wherein said wordline select circuit for said wordline write address receives a write clock signal and said enable redundant wordline signal and said wordline select circuit for said wordline read address receives a read clock signal and said enable redundant wordline signal.

17. A method for disabling non-redundant wordlines and for enabling redundant wordlines using a redundancy circuit for a memory array comprising the steps of:

providing a miscompare detector having a plurality of compare field effect transistors coupled between a common precharge node and a common discharge node for comparing a current address to be accessed with a memory defect address;

said miscompare detector providing an enable redundant wordline signal responsive to a match of the compared addresses;

providing a deactivate driver circuit coupled to said miscompare detector, responsive to said enable redundant wordline signal, for generating a reset signal for disabling non-redundant wordlines; and providing a redundant driver coupled to said miscompare detector, responsive to said enable redundant wordline signal, for activating a redundant wordline for said memory defect address.

18. A method for disabling non-redundant wordlines and for enabling redundant wordlines as recited in claim 17 wherein said generated reset signal deactivates a wordline decoder for the memory array.

19. A method for disabling non-redundant wordlines and for enabling redundant wordlines as recited in claim 18 includes the step responsive to a miscompare of the compared addresses, of allowing a normal access to a non-redundant wordline.

* * * * *